(12) United States Patent
Shih et al.

(10) Patent No.: US 8,232,591 B2
(45) Date of Patent: Jul. 31, 2012

(54) ILLUMINATING EFFICIENCY-INCREASABLE AND LIGHT-ERASABLE MEMORY

(75) Inventors: Hung-Lin Shih, Hsinchu (TW); Wen-Ching Tsai, Hsinchu (TW); Yu-Hua Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 235 days.

(21) Appl. No.: 12/431,130

(22) Filed: Apr. 28, 2009

(65) Prior Publication Data

US 2009/0206384 A1  Aug. 20, 2009

Related U.S. Application Data

(63) Continuation of application No. 11/749,574, filed on May 16, 2007, now Pat. No. 7,544,992.

(51) Int. Cl.
*H01L 29/788* (2006.01)
(52) U.S. Cl. ............ 257/323; 257/315; 257/E29.3
(58) Field of Classification Search ............ 257/323, 257/324, 315, 319, E29.3
See application file for complete search history.

(56) References Cited

U.S. PATENT DOCUMENTS

| | | | | |
|---|---|---|---|---|
| 5,109,261 A | * | 4/1992 | Mead et al. | 257/369 |
| 6,100,117 A | * | 8/2000 | Hao et al. | 438/132 |
| 6,974,989 B1 | * | 12/2005 | Chen et al. | 257/296 |
| 2004/0053467 A1 | * | 3/2004 | Hung et al. | 438/257 |
| 2005/0020021 A1 | * | 1/2005 | Fujiwara et al. | 438/303 |
| 2005/0116333 A1 | * | 6/2005 | Akiyama | 257/698 |
| 2005/0184322 A1 | * | 8/2005 | Inoue | 257/292 |
| 2005/0285215 A1 | * | 12/2005 | Lee et al. | 257/432 |
| 2007/0023799 A1 | * | 2/2007 | Boettiger | 257/292 |

FOREIGN PATENT DOCUMENTS

| | | |
|---|---|---|
| CN | 1438695 A | 8/2003 |
| CN | 1450646 A | 10/2003 |
| JP | 2007189115 | * 1/2006 |

* cited by examiner

*Primary Examiner* — David Vu
*Assistant Examiner* — Duy T Nguyen
(74) *Attorney, Agent, or Firm* — WPAT, PC; Justin King

(57) ABSTRACT

An illuminating efficiency-increasable and light-erasable memory including a substrate, a memory device, many dielectric layers, and many cap layers is provided. The substrate includes a memory region. The memory device includes a select gate and a floating gate, and the select gate and the floating gate are disposed adjacently on the substrate in the memory region. The dielectric layers are disposed on the substrate and cover the memory device. The dielectric layers have an opening located above the floating gate. Each of the cap layers is disposed on each of the dielectric layers, respectively.

10 Claims, 4 Drawing Sheets

ILLUMINATING EFFICIENCY-INCREASABLE AND LIGHT-ERASABLE MEMORY

CROSS-REFERENCE TO RELATED APPLICATION

This is a continuation application of and claims priority benefit of patent application Ser. No. 11/749,574, filed on May 16, 2007. The entirety of the above-mentioned patent application is hereby incorporated by reference herein and made a part of this specification.

BACKGROUND OF THE INVENTION

1. Field of the Invention

The present invention relates to a memory structure and a fabricating method thereof. More particularly, the present invention relates to an illuminating efficiency-increasable and light-erasable embedded memory structure and a fabricating method thereof.

2. Description of Related Art

A memory is a semiconductor device used for storing data or information. The requirement for the memory is getting higher and higher along with the advancement in the function of computer micro-processors and the increase in volume of software programs and calculations. The technique and the process for fabricating memory devices with large-volume and low-cost memory have been driving the semiconductor technology to go towards high integration constantly.

Among various memory products, a non-volatile memory has been applied widely to personal computers and other electronic equipments in which data can be read from, written to, or erased from the non-volatile memory repeatedly and the data stored in the non-volatile memory will not be lost after power off.

FIG. 1 is a cross-sectional view of a conventional single poly non-volatile memory structure.

Referring to FIG. 1, a memory device 102 is disposed on a substrate 100. The memory device 102 includes two metal oxide semiconductor (MOS) transistors 104 and 106 disposed adjacently on the substrate 100, and the gates of the MOS transistors 104 and 106 are respectively used as a select gate 108 and a floating gate 110 of the memory device 102. While programming the memory device 102, charges are stored in the floating gate 110. While erasing the data stored in the memory device 102, conventionally, the floating gate 110 is radiated with a UV light so that the charges stored in the floating gate 110 can be erased.

If the memory device 102 is an embedded memory, a metal interconnect structure covers the memory device 102. In a metal interconnect structure adopting a copper process, the metal interconnect is composed of a plurality of copper metal layers formed in a plurality of dielectric layers, and a silicon nitride layer is formed on each dielectric layer as a cap layer for protecting the copper metal layer.

However, the dielectric layers and the silicon nitride layers absorb the UV light, and the UV light has very low transmittance in the silicon nitride layers. Therefore, while erasing the data stored in the memory device 102, the UV light cannot penetrate the dielectric layers and the silicon nitride layers in the metal interconnect structure effectively in order to radiate the floating gate 110, and accordingly the data stored in the floating gate 110 cannot be erased effectively by the UV light.

SUMMARY OF THE INVENTION

In view of the foregoing, the present invention is directed to an illuminating efficiency-increasable and light-erasable embedded memory structure which can erase the data stored therein effectively by using a UV light.

According to another aspect of the present invention, a fabricating method of an illuminating efficiency-increasable and light-erasable embedded memory structure is provided, and the method can be easily integrated with the existing semiconductor fabricating process.

The present invention provides an illuminating efficiency-increasable and light-erasable embedded memory structure including a substrate, a memory device, a plurality of dielectric layers, a plurality of cap layers and at least three metal layers. The substrate includes a memory region and a core circuit region. The memory device includes a select gate and a floating gate disposed adjacently on the substrate in the memory region. The dielectric layers are disposed on the substrate and cover the memory device, and the dielectric layers have a first opening located above the floating gate. Each of the cap layers is disposed on each of the dielectric layers. The metal layers are disposed in the dielectric layers in the core circuit region.

According to an embodiment of the present invention, in the illuminating efficiency-increasable and light-erasable embedded memory structure, the material of the dielectric layers includes silicon oxide.

According to an embodiment of the present invention, in the illuminating efficiency-increasable and light-erasable embedded memory structure, the material of the cap layers includes silicon nitride.

According to an embodiment of the present invention, in the illuminating efficiency-increasable and light-erasable embedded memory structure, the material of the metal layers includes copper.

According to an embodiment of the present invention, the illuminating efficiency-increasable and light-erasable embedded memory structure further includes a pad and a passivation layer. The pad is disposed in the dielectric layer above the metal layers and is coupled to the metal layers. The passivation layer is disposed on the dielectric layer above the metal layers and covers the pad.

According to an embodiment of the present invention, in the illuminating efficiency-increasable and light-erasable embedded memory structure, the material of the pad includes aluminum.

According to an embodiment of the present invention, in the illuminating efficiency-increasable and light-erasable embedded memory structure, the material of the passivation layer includes silicon nitride.

According to an embodiment of the present invention, in the illuminating efficiency-increasable and light-erasable embedded memory structure, the dielectric layers have a second opening for exposing the pad, and the distance between the bottom of the second opening and the surface of the substrate is greater than the distance between the bottom of the first opening and the surface of the substrate.

According to an embodiment of the present invention, the illuminating efficiency-increasable and light-erasable embedded memory structure, further includes a fuse structure disposed in the dielectric layers in the core circuit region.

According to an embodiment of the present invention, in the illuminating efficiency-increasable and light-erasable embedded memory structure, the dielectric layers have a third opening located above the fuse structure, and the distance between the bottom of the third opening and the surface of the substrate is greater than the distance between the bottom of the first opening and the surface of the substrate.

The present invention provides a fabricating method of an illuminating efficiency-increasable and light-erasable embedded memory structure. The fabricating method includes following steps. First, a substrate including a memory region and a core circuit region is provided. A memory device has been formed on the substrate in the memory region, wherein the memory device includes a select gate and a floating gate disposed adjacently on the substrate. Next, the following steps (a)-(c) are performed repeatedly for at least three times, including (a) forming a dielectric layer on the substrate, wherein the dielectric layer covers the memory device; (b) forming the metal layer in the dielectric layer; (c) forming the cap layer on the dielectric layer. Thereafter, a first opening is formed in the dielectric layers, and the first opening is located above the floating gate.

According to an embodiment of the present invention, the fabricating method of an illuminating efficiency-increasable and light-erasable embedded memory structure, the fabricating method of the dielectric layers further includes following steps. First, a pad is formed in the dielectric layer above the metal layers, and the pad is coupled to the metal layers. Next, a passivation layer is formed on the dielectric layer above the metal layers, and the passivation layer covers the pad. Thereafter, a second opening is formed in the dielectric layer and the passivation layer above the metal layers, and the second opening exposes the pad.

According to an embodiment of the present invention, in the fabricating method of an illuminating efficiency-increasable and light-erasable embedded memory structure, the first opening and the second opening are formed at the same time.

According to an embodiment of the present invention, the fabricating method of an illuminating efficiency-increasable and light-erasable embedded memory structure further includes following steps. First, a fuse structure is formed in the dielectric layers. Next, a third opening is formed in the dielectric layers, and the third opening is located above the fuse structure.

According to an embodiment of the present invention, in the fabricating method of an illuminating efficiency-increasable and light-erasable embedded memory structure, the first, the second, and the third openings are formed at the same time.

According to an embodiment of the present invention, in the fabricating method of an illuminating efficiency-increasable and light-erasable embedded memory structure, the first opening and the third opening are formed at the same time.

As described above, in the illuminating efficiency-increasable and light-erasable embedded memory structure provided by the present invention, the opening is located above the floating gate, such that a UV light can radiate the floating gate through the opening and erase the data stored in the floating gate effectively. Moreover, when a passivation layer is disposed on the surface of the opening, humidity is prevented from entering the metal interconnect structure, and accordingly yield of products is improved.

On the other hand, the fabricating method of an illuminating efficiency-increasable and light-erasable embedded memory structure provided by the present invention is simple and effective, and can be easily integrated with the existing semiconductor fabricating process.

In addition, masks used in the fabricating method and the fabricating cost can be both reduced if the opening above the floating gate is formed together with the opening exposing the pad or the opening above the fuse structure.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 2A~2D are cross-sectional views illustrating a fabrication flow of an illuminating efficiency-increasable and light-erasable embedded memory structure according to an embodiment of the present invention.

Figure 1:
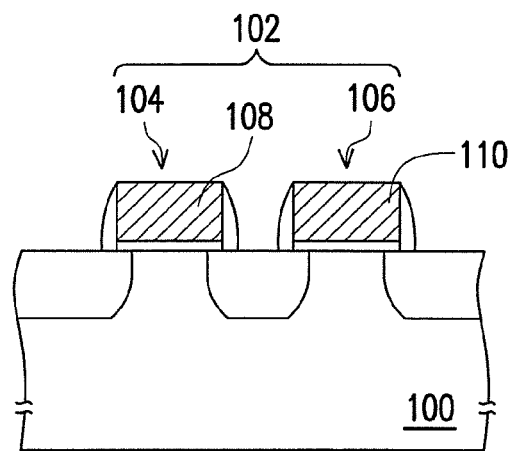
FIG. 1 is a cross-sectional view of a conventional single poly non-volatile memory structure.
Figure 2A:
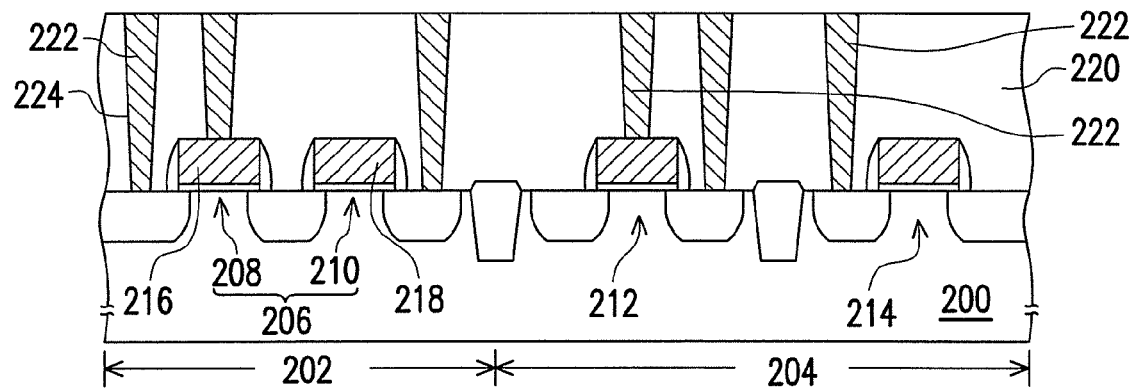
FIGS. 2A~2D are cross-sectional views illustrating a fabrication flow of an illuminating efficiency-increasable and light-erasable embedded memory structure according to an embodiment of the present invention.

First, referring to FIG. 2A, a substrate 200 is provided. The substrate 200 includes a memory region 202 and a core circuit region 204, and a memory device 206 has been formed on the substrate 200 in the memory region 202. The substrate 200 may be a silicon substrate, for example. The memory device 206 may be composed of two MOS transistors 208 and 210 disposed adjacently on the substrate 200, wherein the gates of the MOS transistors 208 and 210 are respectively used as a select gate 216 and a floating gate 218 of the memory device 206. Besides, MOS transistors 212 and 214 may be further formed on the substrate 200 in the core circuit region 204. The materials and methods for forming foregoing various components of the memory device 206 and of the MOS transistors 212, 214 are well-known to those having ordinary knowledge in the art, and therefore no further description will be provided herein.

Next, a dielectric layer 220 is formed on the substrate 200 and covers the memory device 206 and the MOS transistors 212 and 214. The material of the dielectric layer 220 may be silicon nitride, and the formation method of the dielectric layer 220 may be chemical vapor deposition (CVD), for example.

Thereafter, a contact plug 222 is formed in the dielectric layer 220. The material of the contact plug 222 may be a metal such as tungsten, for example. The contact plug 222 may be formed by patterning the dielectric layer 220 first to form a plurality of openings 224 in the dielectric layer 220, and then performing a gap filling process to fill conductive materials into the openings 224.

Figure 2B:
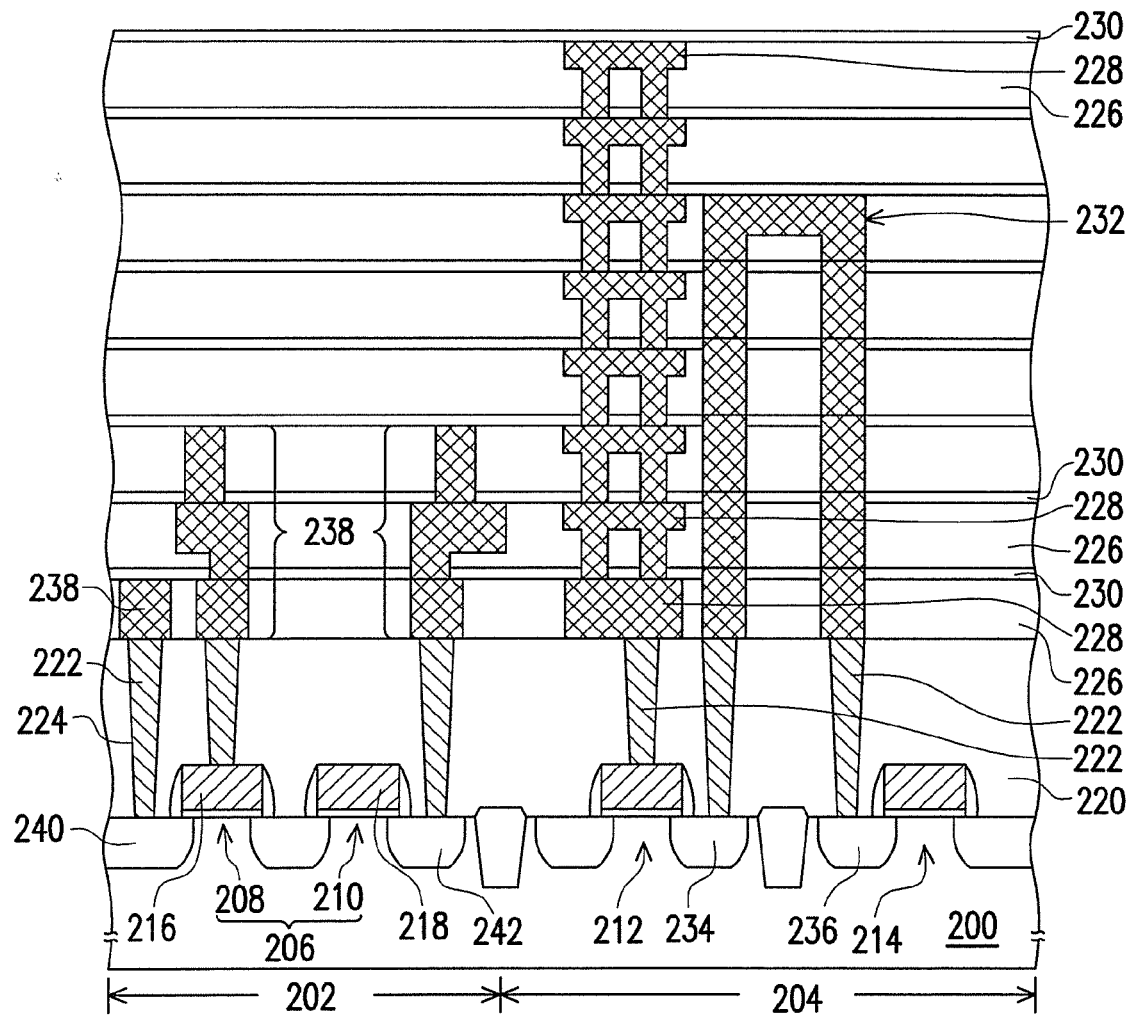

Next, referring to FIG. 2B, a dielectric layer 226 is formed on the dielectric layer 220. The material of the dielectric layer 226 may be silicon oxide, and the formation method of the dielectric layer 226 may be CVD, for example.

After that, a metal layer 228 is formed in the dielectric layer 226, and the metal layer 228 may be used as a metal interconnect structure. The material of the metal layer 228 may be copper, and the metal layer 228 may be formed through a metal damascene process, for example.

Next, a cap layer 230 is formed on the dielectric layer 226. The material of the cap layer 230 may be silicon nitride, and the formation method of the cap layer 230 may be CVD.

Moreover, the foregoing steps for forming the dielectric layer 226, the metal layer 228, and the cap layer 230 are repeated for at least three times. In the present embodiment, these steps are repeated for eight times; however, the number of times for forming the dielectric layer 226, the metal layer 228, and the cap layer 230 and the thicknesses of the three layers can be adjusted according to the design of the metal interconnect structure by those having ordinary knowledge in the art.

Furthermore, while repeating the steps of forming the dielectric layer 226, the metal layer 228, and the cap layer 230, a fuse structure 232 may be formed in the dielectric layer 226, and the fuse structure 232 may be coupled to a doped region 234 of the MOS transistor 212 and a doped region 236 of the MOS transistor 214 via the contact plug 222. The material of the fuse structure 232 may be copper, and the fuse structure 232 may be formed through the metal damascene process, for example. The fuse structure 232 can be adopted for repairing circuits by utilizing a laser beam to radiate the fuse structure 232. As such, there are no other metal layers above the fuse structure 232. Moreover, as the laser beam is employed for repairing the circuits, the opening is usually reserved on top of the fuse structure 232 in favor of repairing the circuits through the laser beam.

In addition, while forming the dielectric layer 226, the metal layer 228, and the cap layer 230 repeatedly, a conductive wire 238 may be formed in the dielectric layer 226 at the same time, and the conductive wire 238 may be respectively coupled to the doped regions 240, 242 and the select gate 216 of the memory device 206 via the contact plug 222. The material of the conductive wire 238 may be copper, and the conductive wire 238 may be formed through the metal damascene process, for example.

Figure 2C:
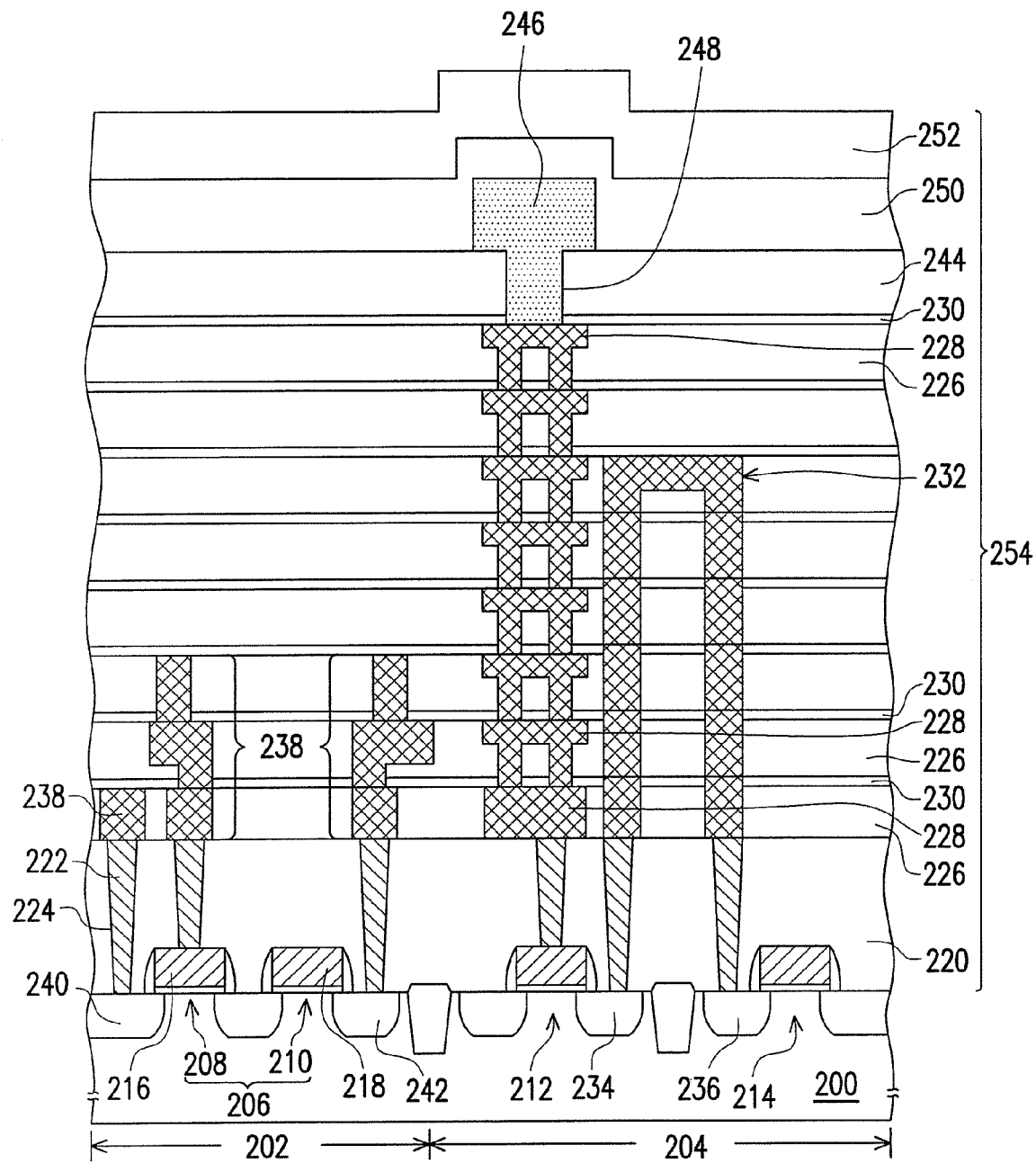

Next, referring to FIG. 2C, a dielectric layer 244 is formed on the cap layer 230. The material of the dielectric layer 244 may be silicon oxide, and the formation method of the dielectric layer 244 may be CVD, for example.

Thereafter, a pad 246 is formed in the dielectric layer 244, and the pad 246 is coupled to the metal layer 228. The material of the pad 246 may be aluminum, and the pad 246 may be formed through forming an opening 248 in the dielectric layer 244 and forming a pad material layer on the dielectric layer 244 to fill the opening 248. After that, a photolithography process and an etching process are performed to define the pad 246. In another embodiment, the pad 246 may also be constructed by performing the metal damascene process.

Afterwards, a dielectric layer 250 is formed on the dielectric layer 244 and covers the pad 246. The material of the dielectric layer 250 may be phosphosilicate glass, and the dielectric layer 250 may be formed by CVD.

Next, a passivation layer 252 is formed on the dielectric layer 250. The material of the passivation layer 252 may be silicon nitride, and the formation method of the passivation layer 252 may be CVD.

In the present embodiment, the metal interconnect structure 254 may be composed of the dielectric layer 220, the contact plug 222, the dielectric layer 226, the metal layer 228, the cap layer 230, the fuse structure 232, the conductive wire 238, the dielectric layer 244, the pad 246, the dielectric layer 250, and the passivation layer 252, for example.

Figure 2D:
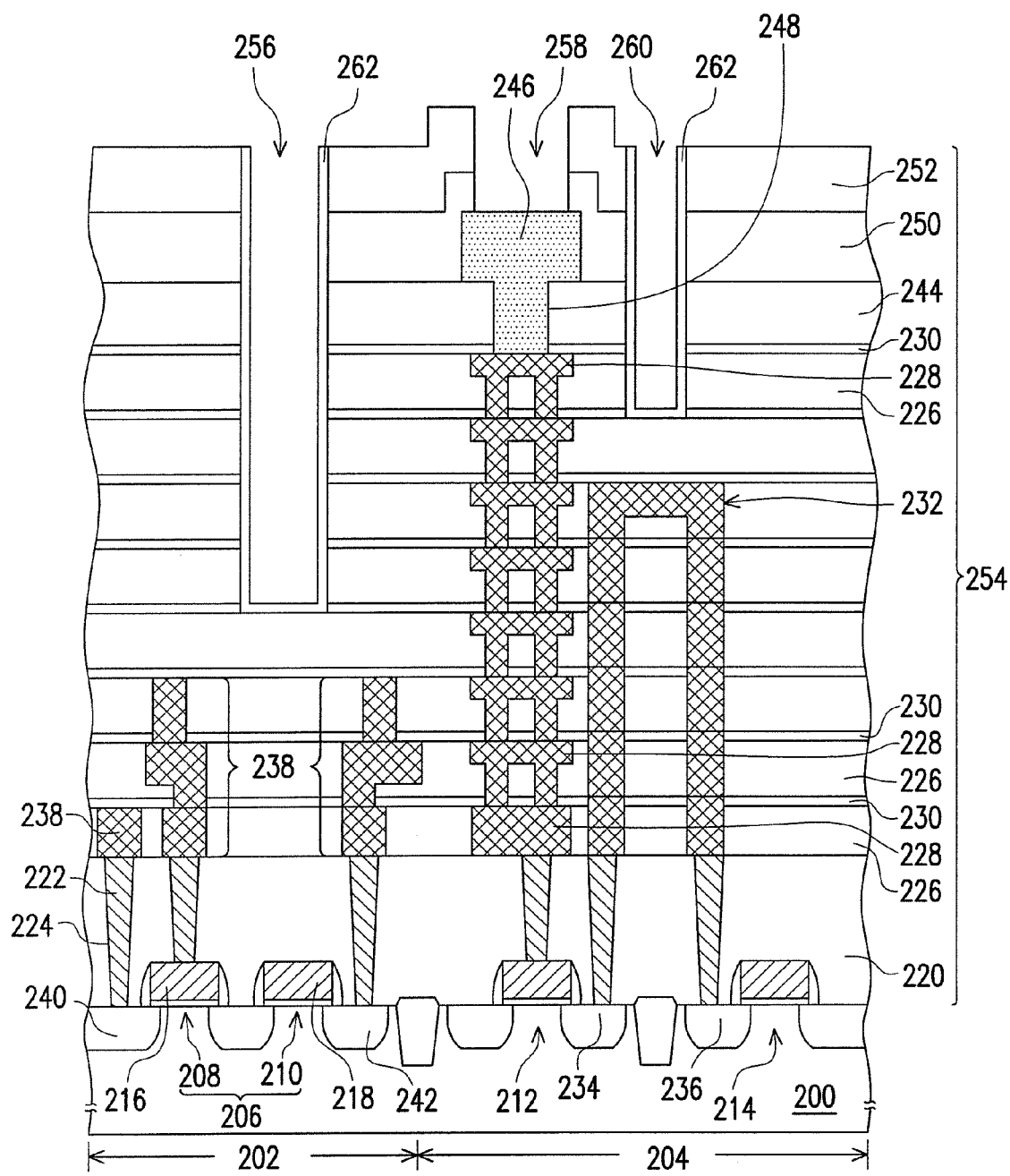

Next, referring to FIG. 2D, an opening 256 is formed in the dielectric layers 226, 244, 250 and the passivation layer 252 of the metal interconnect structure 254, and the opening 256 is located right above the floating gate 218 and is open at an end far away from the floating gate 218. The opening 256 may be formed by patterning the metal interconnect structure 254 to remove parts of the passivation layer 252, the dielectric layer 250, the dielectric layer 244, the cap layer 230, and the dielectric layer 226 right above the floating gate 218. The opening 256 has a vertical profile. In the present embodiment, five cap layers 230 and four dielectric layers 226 are removed; however, the numbers of the cap layers 230 and the dielectric layers 226 to be removed can be adjusted by those having ordinary knowledge in the art according to the requirement of product design.

Generally speaking, it is desirable to remove the cap layers 230 and the dielectric layers 226 as many as possible because the UV light absorbed by the cap layers 230 and the dielectric layers 226 can be minimized while erasing the data stored in the memory device 206. Thus, the UV light can radiate the floating gate 218 effectively via the opening 256 to remove the data stored in the floating gate 218.

In addition, an opening 258 may be formed in the dielectric layer 250 and the passivation layer 252 above the pad 246 of the metal interconnect structure 254. The opening 258 exposes the pad 246, such that the pad 246 can be coupled to external conductive wires (not shown).

Moreover, an opening 260 may be further formed in the dielectric layers 226, 244, 250 and the passivation layer 252 of the metal interconnect structure 254. The opening 260 is located above the fuse structure 232 but does not expose the fuse structure 232. The function of the opening 260 is to reserve some space for repairing the circuits by using the fuse structure 232.

It should be noted that the opening 256 may be formed individually. Besides, since the formation of the opening 258 above the pad 246 is necessary, the openings 256 and 258 may be formed together to reduce the number of the required masks and the manufacturing costs. Moreover, according to the device requirements, the opening 260 may be selectively formed. Likewise, if the formation of the opening 260 is deemed necessary, the openings 256 and 260 may also be formed together for the purpose of reducing the number of the masks as well as the manufacturing costs. In addition, during the formation of the openings 258 and 260, the etched depth of the two openings can be accumulated to that of the opening 256, enhancing the applicability of the openings. Thereafter, a passivation layer 262 may be selectively formed on the surfaces of the openings 256 and 260 in order to prevent humidity from entering the metal interconnect structure 254. The material of the passivation layer 262 may be silicon oxide or silicon nitride, and the formation method of the passivation layer 262 may be CVD, for example.

In the embodiment described above, less UV light for erasing the data stored in the memory device 206 is absorbed by the cap layer 230 and the dielectric layer 226 because parts of the cap layer 230 and the dielectric layer 226 are removed to form the opening 256 in the metal interconnect structure 254 right above the floating gate 218. As such, the UV light can radiate the floating gate 218 effectively via the opening 256 to remove the data stored in the floating gate 218.

On the other hand, the formation method of the opening 256 can be easily integrated with the existing semiconductor fabricating process, and therefore the fabricating method of an illuminating efficiency-increasable and light-erasable embedded memory structure in the present embodiment is simple and effective.

Below, the illuminating efficiency-increasable and light-erasable embedded memory structure in the present invention will be described with reference to FIG. 2D.

Referring to FIG. 2D, the illuminating efficiency-increasable and light-erasable embedded memory structure includes the substrate 200, the memory device 206, and the metal interconnect structure 254. The substrate 200 includes the memory region 202 and the core circuit region 204.

The memory device 206 includes the MOS transistors 208 and 210 disposed adjacently on the substrate 200, and the gates of the MOS transistors 208 and 210 are respectively used as the select gate 216 and floating gate 218 of the memory device 206. The materials and the formation methods of various components in the memory device 206 have been described in detail in the aforesaid embodiment, and therefore no further description will be provided herein.

The metal interconnect structure 254 is disposed on the substrate 200 and covers the memory device 206. The metal interconnect structure 254 has the opening 256 located above the floating gate 218. The metal interconnect structure 254 may be composed of the dielectric layer 220, the contact plug 222, the dielectric layer 226, the metal layer 228, the cap layer 230, the fuse structure 232, the conductive wire 238, the dielectric layer 244, the pad 246, the dielectric layer 250, and the passivation layer 252, for example. Generally speaking, there are at least three metal layers 228 in the metal interconnect structure 254; however, the number of layers of the dielectric layers 226, the metal layers 228, and the cap layers 230 can be adjusted according to the design of the metal interconnect by those having ordinary knowledge in the art. The relative positions, materials, and formation methods of various components of the metal interconnect structure 254 have been described in detail in the aforesaid embodiment, and therefore no further description will be provided herein.

Besides, the metal interconnect structure 254 may have the opening 258 to expose the pad 246, such that the pad 246 can be coupled to the external conductive wires (not shown). Further, to better repair the circuits with use of the laser beam, the opening 260 may be further formed above the fuse structure 232 of the metal interconnect structure 254.

Noted that when the opening 256 is individually formed, the depth of the opening 256 should comply with the required depth, preferably going as deep as it can, so as to erase the data stored in the memory device 206 with use of the UV light. Additionally, as the openings 256 and 258 are formed together, the opening 256 may be in a greater depth than the opening 258 is, for the bottom of the opening 258 is blocked by the pad 246. By contrast, as the openings 256 and 260 are constructed together, the depth reached by each is approximately the same. Further, as the openings 256, 258 and 260 are formed all together, the etched depth of the openings 258 and 260 can be accumulated, and thus a greater depth can be achieved.

In addition, the illuminating efficiency-increasable and light-erasable embedded memory structure further includes the passivation layer 262. The passivation layer 262 is disposed on the surfaces of the openings 256 and 260 for preventing humidity from entering the metal interconnect structure 254 in order to improve yield the product. The material of the passivation layer 262 includes silicon oxide or silicon nitride.

As described above, in the illuminating efficiency-increasable and light-erasable embedded memory structure, the opening 256 is located right above the floating gate 218, such that the UV light for erasing the data stored in the memory device 206 can radiate the floating gate 218 via the opening 256 and remove the data stored in the floating gate 218 effectively.

In summary, the present invention has at least the following advantages:

1. The data stored in the illuminating efficiency-increasable and light-erasable embedded memory structure in the present invention can be removed with the UV light effectively.

2. The illuminating efficiency-increasable and light-erasable embedded memory structure in the present invention can prevent damage caused by humidity, and therefore yield of the product can be improved.

3. The fabricating method of the illuminating efficiency-increasable and light-erasable embedded memory structure in the present invention is simple and effective, and the method can be easily integrated with the existing semiconductor fabricating process.

4. Fewer masks are used in the fabricating method of the illuminating efficiency-increasable and light-erasable embedded memory structure in the present invention, and accordingly the fabricating cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An illuminating efficiency-increasable and light-erasable memory, comprising:
    a substrate, comprising a memory region and a core circuit region;
    a memory device, comprising a select gate and a floating gate, wherein the select gate and the floating gate are disposed adjacently on the substrate in the memory region;
    a plurality of dielectric layers, disposed on the substrate and covering the memory device;
    a plurality of metal layers, disposed in the dielectric layers respectively and located in the core circuit region; and
    a plurality of cap layers, disposed on the dielectric layers respectively;
    wherein an opening is located right above the floating gate, the opening penetrates through the dielectric layers and the cap layers so as to expose a surface of one of the dielectric layers and the cap layers, the surface is lower than an uppermost metal layer of the metal layers, and the opening is light-penetrable.

2. The illuminating efficiency-increasable and light-erasable memory of claim 1, wherein the material of the dielectric layers comprises silicon oxide.

3. The illuminating efficiency-increasable and light-erasable memory of claim 1, wherein the material of the cap layers comprises silicon nitride.

4. The illuminating efficiency-increasable and light-erasable embedded memory of claim 1, further comprising:
    a passivation layer, disposed on the dielectric layers.

5. The illuminating efficiency-increasable and light-erasable memory of claim 4, wherein the passivation layer is further disposed to cover a sidewall and a bottom surface of the opening.

6. The illuminating efficiency-increasable and light-erasable memory of claim 5, wherein the material of the passivation layer comprises silicon nitride.

7. The illuminating efficiency-increasable and light-erasable memory of claim 1, further comprising:
    a first passivation layer, disposed on the dielectric layers; and
    a second passivation layer, disposed to cover a sidewall and a bottom surface of the opening.

8. The illuminating efficiency-increasable and light-erasable memory of claim 1, further comprising:
    a conductive wire connecting to the memory device, disposed in a portion of the dielectric layers under the opening.

9. The illuminating efficiency-increasable and light-erasable memory of claim 1, wherein the opening is open at an end far away from the floating gate.

10. The illuminating efficiency-increasable and light-erasable memory of claim 1, the opening has a vertical profile.

* * * * *